US011552211B2

United States Patent
Nelson et al.

(10) Patent No.: US 11,552,211 B2
(45) Date of Patent: *Jan. 10, 2023

(54) MOLDABLE PHOTOVOLTAIC SOLAR CELL MODULE

(71) Applicant: National Technology & Engineering Solutions of Sandia, LLC, Albuquerque, NM (US)

(72) Inventors: Jeffrey S. Nelson, Albuquerque, NM (US); Michael Hibbs, Albuquerque, NM (US); Gregory N. Nielson, Lehi, UT (US); Murat Okandan, Edgewood, NM (US); Jose Luis Cruz-Campa, Albuquerque, NM (US); Paul J. Resnick, Albuquerque, NM (US); Carlos Anthony Sanchez, Belen, NM (US); Vipin P. Gupta, Glenview, IL (US); Peggy J. Clews, Tijeras, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 827 days.

This patent is subject to a terminal disclaimer.

(21) Appl. No.: 16/040,174

(22) Filed: Jul. 19, 2018

(65) Prior Publication Data

US 2018/0323324 A1 Nov. 8, 2018

Related U.S. Application Data

(63) Continuation of application No. 14/950,763, filed on Nov. 24, 2015, now Pat. No. 10,038,113, which is a
(Continued)

(51) Int. Cl.
*H01L 31/05* (2014.01)
*H01L 31/0465* (2014.01)
(Continued)

(52) U.S. Cl.
CPC .. *H01L 31/0516* (2013.01); *H01L 31/022441* (2013.01); *H01L 31/048* (2013.01);
(Continued)

(58) Field of Classification Search
CPC ....... H01L 31/0465; H01L 31/05–0516; H01L 31/048; H01L 31/0481; H01L 31/049;
(Continued)

(56) References Cited

U.S. PATENT DOCUMENTS 3,375,141 A 3/1968 Julius
4,089,705 A 5/1978 Rubin
(Continued)

FOREIGN PATENT DOCUMENTS

WO 2008143635 A1 11/2008
WO 2014159146 A1 2/2014

OTHER PUBLICATIONS

Welch Fluorocarbon, Inc. "PVF" http://www.welchfluorocarbon.com/material-profiles/films/pvf/ Accessed online Jan. 17, 2017, Screencapture dated Oct. 18, 2013. (Year: 2013).*
(Continued)

*Primary Examiner* — Dustin Q Dam
(74) *Attorney, Agent, or Firm* — Martin I. Finston; Mark A. Dodd

(57) ABSTRACT

A moldable photovoltaic module is provided. The module includes a flexible polymeric flex-circuit substrate having an electrically conductive printed wiring pattern and solder pads defined on it. Small photovoltaic cells are affixed to the flex-circuit substrate by back-surface contacts in electrical contact with the solder pads. At least one thermoformable polymeric film is joined to the flex-circuit substrate. Each said solder pad comprises a solder composition that, after an
(Continued)

initial melt, has a melting point that lies above at least a portion of the temperature range for thermoforming the polymeric film.

10 Claims, 13 Drawing Sheets

Related U.S. Application Data continuation-in-part of application No. 13/240,127, filed on Sep. 22, 2011, now abandoned.

(51) Int. Cl.
| | | |
|---|---|---|
| H01L 31/048 | (2014.01) | |
| H01L 31/0224 | (2006.01) | |
| H02S 30/20 | (2014.01) | |
| H02S 10/40 | (2014.01) | |
| H01L 31/054 | (2014.01) | |

(52) U.S. Cl.
CPC ...... *H01L 31/0465* (2014.12); *H01L 31/0512* (2013.01); *H01L 31/0547* (2014.12); *H02S 10/40* (2014.12); *H02S 30/20* (2014.12); *Y02E 10/50* (2013.01); *Y02E 10/547* (2013.01)

(58) Field of Classification Search
CPC ......... H01L 31/022441; H01L 31/0516; H02S 30/20; Y02E 10/547
USPC .................................................. 136/243–265
See application file for complete search history.

(56) References Cited

U.S. PATENT DOCUMENTS

| | | | |
|---|---|---|---|
| 6,313,395 | B1 | 11/2001 | Crane et al. |
| 6,613,123 | B2 | 9/2003 | Corbin et al. |
| 6,906,253 | B2 | 6/2005 | Bauman et al. |
| 9,093,586 | B2 | 7/2015 | Lentine et al. |
| 9,095,936 | B2 | 8/2015 | McIsaac et al. |
| 9,352,853 | B2 | 5/2016 | Eskenazi et al. |
| 2004/0243204 | A1 | 12/2004 | Maghribi et al. |
| 2007/0249748 | A1 | 10/2007 | Kura et al. |
| 2009/0032087 | A1 | 2/2009 | Kalejs |
| 2009/0126775 | A1 | 5/2009 | White et al. |
| 2010/0101627 | A1 | 4/2010 | Patel |
| 2010/0206352 | A1 | 8/2010 | Gee et al. |
| 2010/0218805 | A1 | 9/2010 | Everett et al. |
| 2010/0233843 | A1 | 9/2010 | Frolov et al. |
| 2010/0307567 | A1 | 12/2010 | Huang |
| 2014/0060611 | A1 | 3/2014 | Koch et al. |
| 2014/0157693 | A1 | 6/2014 | Schumacher |
| 2014/0261624 | A1 | 9/2014 | Cruz-Campa et al. |
| 2014/0263847 | A1 | 9/2014 | Eskenazi et al. |
| 2016/0035924 | A1 | 2/2016 | Oraw et al. |
| 2017/0288081 | A1 | 10/2017 | Babyan et al. |

OTHER PUBLICATIONS

Baca et al. "Compact monocrystalline silicon solar modules with high voltage outputs and mechanically flexible designs." Energy Environ. Sci., 2010, 3, 208-211. Published on the web Jan. 11, 2010.

Corbin, S. F. "High-Temperature Variable Melting Point Sn—Sb Lead-Free Solder Pastes Using Transient Liquid-Phase Powder Processing" Journal of Electronic Materials, 2005, pp. 1016-1024, vol. 34.

Cruz-Campa, J. et al. "Microsystems enabled photovoltaics: 14.9% efficient 14 um thic crystalline silicon solar cell" Solar Energy Materials & Solar Cells, 2011, pp. 551-558, vol. 95.

Cruz-Campa, J. et al. "Ultrathin Flexible Crystalline Silicon: Microsystems-Enabled Photovoltaics" Journal of Photovoltaics, 2011, pp. 2156-3381, vol. 10.

Franklin, E. et al. "Silver Solar Cells", Proc of SPIE, 2012, pp. 680010-1-680010-11, vol. 6800.

Franklin, E. et al. "Sliver Solar Cells: High-Efficiency, Low-Cost PV Technology", Advances in OptoElectronics, 2007, pp. 1-9. vol. 2007.

Gupta, V. et al. "Microsystems-Enabled Photovoltaics: A Path to the Widespread Harnessing of Solar Energy" Future Photovoltaics, 2010.

Nielson, G. N.et al. "Microscale C—Si (C)PV Cells for Low-Cost Power", IEEE Sandia National Laboratories, 2009, pp. 1816-1821.

Nielson, G. N. et al. "Microscale PV Cells for Concentrated PV Applications".

Yoon, J. et al. "Ultrathin Silicon Solar Mocrocells for Semitransparent, Mechanically Flexible and Microconcentrator Module Designs", Natural Materials.

* cited by examiner

MOLDABLE PHOTOVOLTAIC SOLAR CELL MODULE

CROSS-REFERENCE TO RELATED APPLICATIONS

This application is a continuation of the commonly owned U.S. patent application Ser. No. 14/950,763 filed on Nov. 24, 2015 under the title "Moldable Photovoltaic Solar Cell Module".

The abovesaid U.S. application Ser. No. 14/950,763 is a continuation-in-part of the commonly owned U.S. patent application Ser. No. 13/240,127 filed on Sep. 22, 2011 under the title "Moldable Photovoltaic Solar Cell Module", the entirety of which is hereby incorporated herein by reference.

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to photovoltaic solar cell modules, and in particular moldable photovoltaic solar cell modules and flexible photovoltaic solar cell modules.

BACKGROUND

The adoption of photovoltaics for generating electricity from sunlight is largely driven by cost considerations. At present, photovoltaic systems are not competitive with fossil-fuel generated electricity. Thus, there is a need to reduce the overall photovoltaic system cost. This entails reducing the cost of photovoltaic modules as well as module assembly costs with enhanced functionality.

One way to reduce costs is to reduce the size of the photovoltaic solar cells. In this aspect, small and thin photovoltaic cells have been developed that reduce photovoltaic material use dramatically. These thin photovoltaic cells are typically formed on top of a handle wafer. Once formed, the cells may be individually detached from the handle wafer by, for example, an etching process using a hydrofluoric acid (HF) solution to undercut the cells. These "free floating" cells may then be assembled into sheets by attracting the individual cells to a desired position on a sheet of material using self-assembly techniques. Finally, the cells may be embedded in a low-cost substrate with contacts and microlenses to form photovoltaic sheets.

SUMMARY

An embodiment of the invention is a moldable solar cell module having a plurality of solar cells, each of the plurality of solar cells comprising a surface having an electrical contact formed thereon. A receiving substrate is positioned along the surface of the plurality of solar cells having the electrical contact formed thereon. The receiving substrate comprises a conductive material electrically coupled to each of the plurality of solar cells at the electrical contact and a dielectric material that maintains isolation between oppositely signed solar cell electrical contacts. The dielectric material forms a backing sheet that mechanically supports the electrically conductive material. A moldable or highly flexible fill material overlies the plurality of solar cells and the receiving substrate. The fill material may be comprised of two or more different materials in the same module for mechanical purposes. In addition, a first film is positioned along a side of the fill material opposite the solar cells. The first film and the fill material can be the same material. A second film is optionally positioned along a side of the receiving substrate opposite the solar cells. The second film can be the same material as the receiving substrate dielectric material.

In one embodiment, the receiving substrate is a flexible circuit and each cell of the plurality of solar cells is attached to the conductive material by solder bumps. In this aspect, photovoltaic functionality of the solar cells is maintained even while attached to the receiving substrate. The moldable fill material may be a material such as ethylene-vinyl-acetate (EVA) that has thermoplastic properties so that the solar cell module can be molded into a three-dimensional shape by heating and cooling the module. The plurality of solar cells may be arranged in a honeycomb like pattern. The arrangement of the solar cells within the solar cell module as well as the reduced size of the solar cells allows the solar cell module to have a high degree of flexibility. Representatively, the solar cell module may have a bend radius of from about 0.75 millimeters (mm) to about 10 mm in multiple directions.

In one embodiment, the moldable solar cell module may be formed into a desired three-dimensional shape by heating the solar cell module and pressing the module between two mating molds. Alternatively, the solar cell module may be vacuum formed to a single mating mold. The solar cell module may then be cooled to retain the desired three-dimensional shape. In some cases, a moldable material may be added to the mold along with the solar cell module to increase a thickness of the molded three-dimensional shape. The molded three-dimensional shape may be a part suitable for use in a variety of structures, for example, a personal electronic device, outdoor gear, military gear, outdoor furniture, tiles, building integrated materials, cars, boats, planes or any other device that could benefit from solar power.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

In this section we shall explain several preferred embodiments of this invention with reference to the appended drawings. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known structures and techniques have not been shown in detail so as not to obscure the understanding of this description.

Figure 1A:
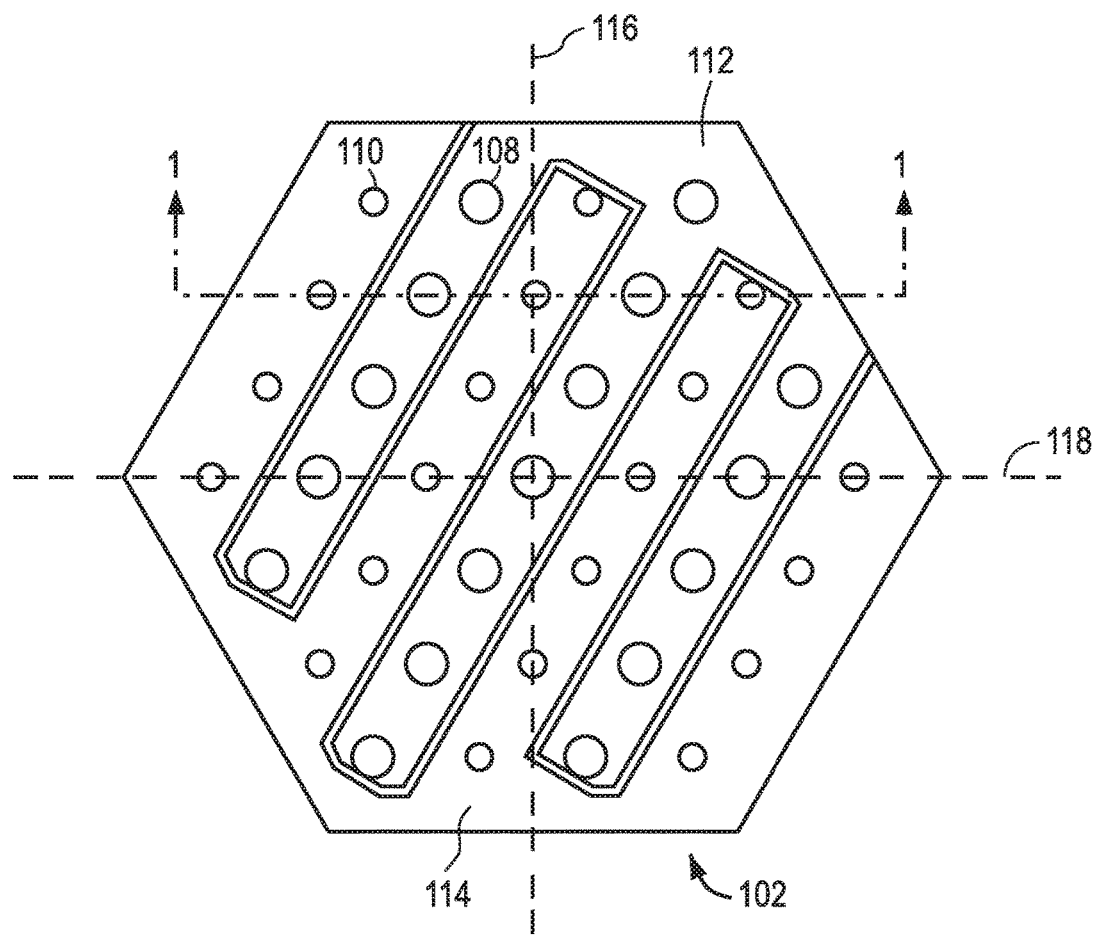
FIG. 1A shows a schematic plan view of a transverse-junction photovoltaic solar cell.
Figure 1B:
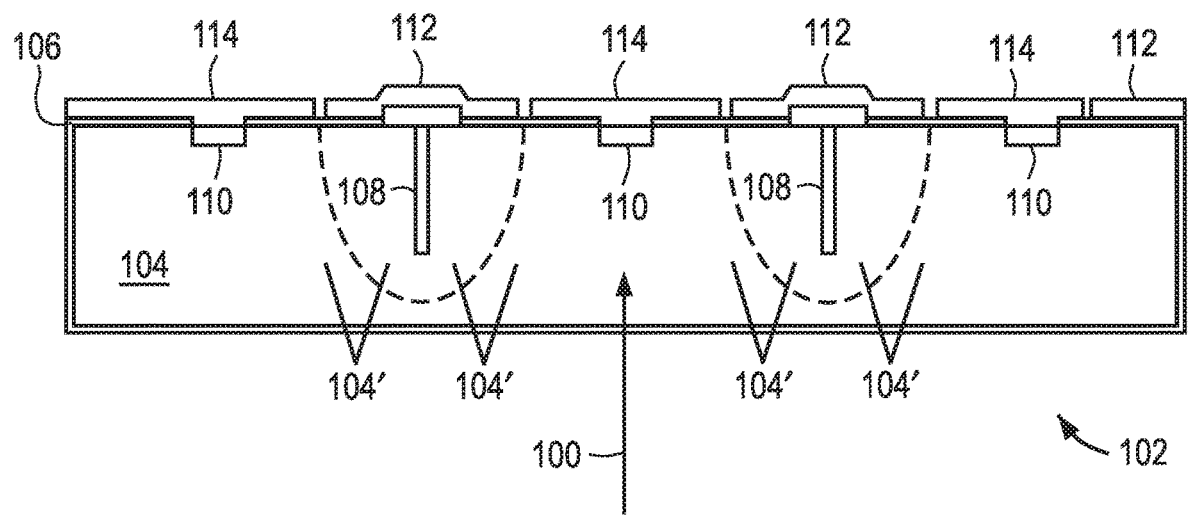
FIG. 1B shows a schematic cross-section view (along the section line 1-1 in FIG. 1A) of a transverse junction photovoltaic solar cell.

FIG. 1A and FIG. 1B schematically illustrate a photovoltaic solar cell. In FIG. 1A, a bottom surface of solar cell 102 is shown. FIG. 1B shows a schematic cross-section along the section line 1-1 in FIG. 1A. The terms "photovoltaic solar cell", "solar cell" and "cell" may be used interchangeably through the foregoing description to refer to photovoltaic solar cell 102.

Solar cell 102 may be a transverse-junction solar cell (also referred to as a point contact solar cell). In this aspect, solar cell 102 comprises a plurality of spaced-apart transverse semiconductor junctions which comprise n-type-doped and p-type-doped regions formed in a semiconductor substrate 104 which can be lightly doped (e.g., to $10^{17}$ cm$^{-3}$ or less) with a p-type or an n-type impurity dopant. Alternately, semiconductor substrate 104 can be intrinsic (i.e., not intentionally doped). Altogether, tens to hundreds of transverse semiconductor junctions can be located in solar cell 102 which can have lateral dimensions of generally from about 0.1 mm to about 1 mm, with adjacent transverse semiconductor junctions being separated by about 20 micrometers (μm) to about 50 μm.

Fabrication of solar cell 102 will be described hereinafter for solar cell 102 comprising silicon, although it is contemplated that solar cell 102 can comprise other types of semiconductors including germanium, II-VI, III-V, and III-nitride compound semiconductors (e.g., gallium arsenide, indium gallium phosphide, indium gallium arsenide, indium gallium nitride, etc.).

Substrate 104 can be a silicon substrate initially prepared by forming passivation layer 106 of silicon dioxide or silicon nitride over the major surfaces of substrate 104. This can be done by a thermal oxidation process, or alternately by chemical vapor deposition (CVD). Passivation layer 106 can be, for example, from about 25 to about 200 nanometers (nm) thick.

A plurality of generally circular openings having a width of up to a few microns can then be etched through passivation layer 106 and optionally partway through substrate 104 to a depth of a few microns. This can be done by anisotropically etching the openings using a reactive ion etching step with a photolithographically-defined etch mask (not shown). These openings can be used to define doped regions to create a p-n junction for the solar cell.

To create the doped regions, the openings can be filled with either crystalline silicon or polycrystalline silicon 108 (also termed polysilicon) having a doping type which is opposite the doping type of substrate 104 (e.g., n-type-doped when substrate 104 is p-type-doped). Polysilicon 108, which can be deposited by CVD, fills in the openings and can extend over the top of substrate 104. A reactive ion etching step using another photolithographically-defined etch mask can then be used to remove any excess polysilicon 108 to provide an exposed circular or polygonal top surface for polysilicon 108 as shown FIGS. 1A and 1B. Alternatively, ion implantation or solid-source diffusion of dopants can be used to create the doped region 108 without requiring a crystalline or polycrystalline silicon deposition.

Region 110 with a doping type the same as substrate 104 can be formed adjacent to each polysilicon region 108 through the use of ion implantation or solid source diffusion (which would require opening a window in the passivation layer). The dopant concentration in doped region 110 being higher than that of substrate 104 (e.g., p$^+$ doped when substrate 104 is p-doped). Ions of boron or phosphorous can be implanted into substrate 104 to form ion-implanted region 110 depending on whether doped region 110 is p-type doped or n-type doped, respectively. Doped region 110 can extend down into silicon substrate 104 for a distance of up to about 1 μm.

Electrical contact 112 can be deposited over substrate 104 to contact all of doped regions 108 in parallel. Electrical contact 112 may be an electrode made of aluminum, and can be shaped, for example, as shown in FIGS. 1A and 1B. Another electrical contact 114 can similarly contact all of doped regions 110 in parallel. Electrical contact 114 may be of an aluminum electrode similar to electrical contact 112. Electrical contacts 112 and 114 are electrically isolated from substrate 104 by the intervening passivation layer 106. Since both electrical contacts 112 and 114 are located on the same side of solar cell 102 electrical connections to solar cell 102 are made simpler. Also, sunlight entering solar cell 102 is not shaded by electrical contacts 112 and 114 since the sunlight enters solar cell 102 on a side opposite contacts 112 and 114. Furthermore, electrical contacts 112 and 114 act as mirrors to reflect any of the sunlight that is not absorbed in a monocrystalline silicon light-absorbing region 104' (i.e., a portion 104' of semiconductor substrate 104 between each adjacent pair of the electrical contacts 112 and 114) back through the light-absorbing region 104' a second time. This increases the efficiency of solar cell 102 for generating electricity by increasing the amount of the sunlight which is absorbed in solar cell 102 to produce electrical charge carriers (i.e., electrons and holes) therein.

Generally, a large number of solar cells 102 will be fabricated on a 4 to 12 inch wafer and then separated. Each solar cell 102 may have a polygonal shape with lateral dimensions of, for example, up to about 1 millimeter (mm), for example, from about 0.25 mm to about 0.75 mm, or from 0.4 to 0.6 mm. In some embodiments, the lateral dimensions may be a length and a width dimension that are substantially equal such that solar cell is symmetrical about at least two perpendicular axes 116, 118. Representative polygonal shapes may include, but are not limited to, a hexagon, a square, a rectangle or a triangle. Although polygonal shapes are disclosed, it is contemplated that solar cell 102 may have any other shape deemed desirable, for example, a circular shape. Each photovoltaic solar cell 102 can be made thin (e.g., ≤50 μm and preferably ≤20 μm, such as from 5-10 μm) to mitigate against bulk Auger recombination which can occur when a density of photogenerated carriers is non-uniform over the thickness of solar cell 102.

Different techniques are available to fabricate solar cell 102 with a thickness which is less than 50 μm and preferably less than 20 μm, for example in the range of 5-10 μm depending on whether solar cell 102 is to be fabricated from a silicon-on-insulator (SOI) wafer, or from a monocrystalline silicon wafer and a different separation method such as porous silicon or potassium hydroxide (KOH) selective etch. One embodiment of a technique for fabricating solar cell 102 from a silicon-on-insulator (SOI) wafer is described below in reference to FIG. 2.

Figure 2:
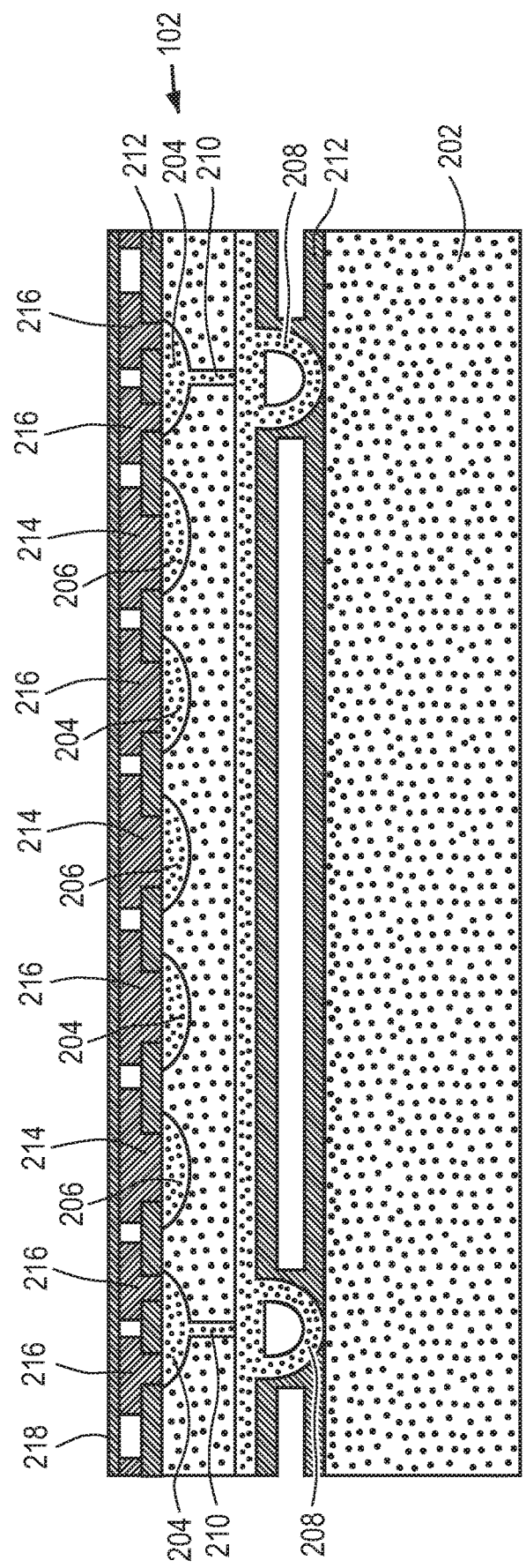
FIG. 2 shows a schematic cross-section view (along the section line 1-1 in FIG. 1A) to illustrate fabrication of the transverse-junction photovoltaic solar cell of FIG. 1A on an SOI wafer.

FIG. 2 shows a schematic cross-section view along the section line 1-1 in FIG. 1A. In this embodiment, solar cell 102 is suspended from substrate 202 in the fabrication process, allowing for passivation of all major surfaces of solar cell 102. Posts 210 and anchors/tethers 208 as will be discussed in more detail below, provide this suspension. Although a single solar cell 102 is illustrated and described below, it is contemplated that a plurality of cells may be formed on substrate 202 and formed in substantially the same manner as described in reference to FIG. 2.

In one embodiment, substrate 202 may be an SOI wafer having a monocrystalline silicon body, an oxide layer on the monocrystalline silicon body, and a monocrystalline silicon layer on the oxide layer. Alternatively, substrate 202 may be a monocrystalline silicon wafer. The thickness of the monocrystalline silicon layer of substrate 202, and therefore solar cell 102, may be, for example, from about 5 μm to about 50 preferably less than about 20 μm. Openings are etched, e.g., using deep reactive-ion etching, through the monocrystalline silicon layer and the oxide layer and spaced about a periphery of solar cell 102 being formed. These openings are filled with polysilicon, thereby forming a plurality of anchors 208 in the oxide layer and a plurality of posts 210 in the monocrystalline silicon layer of SOI wafer 202. In one embodiment, anchors 208 include dimples. The polysilicon used to fill the post openings can be doped, e.g., n-type, or undoped. The nitride from the etching process is then stripped from the surface of solar cell 102.

Doped regions are then formed at the bottom surface of solar cell 102, i.e., the side of solar cell 102 opposite from the side that receives sunlight when the cell is used. Regions that are n-type-doped 206 and regions that are p-type-doped 204 are formed, interspersed with each other, at the monocrystalline silicon layer. Doping includes thermally diffusing an n-type dopant into the monocrystalline silicon layer to form n-type-doped regions 206 and thermally diffusing a p-type dopant into the monocrystalline silicon layer to form p-type-doped regions 204. For example, doping includes thermally diffusing the n-type dopant from a phosphosilicate glass or a phosphorous spin-on glass and thermally diffusing the p-type dopant from a borosilicate glass or a boron spin-on glass. In another example, doping includes ion-implanting phosphorous ions to form the n-type-doped regions 206 and ion-implanting boron to form the p-type-doped regions 204.

To create sidewalls that define the shape of solar cell 102, an annular trench is etched through the monocrystalline silicon layer. This results in an outlet through which undercutting of solar cell 102 can occur. The oxide layer of substrate 202 is etched away and therefore creates an opening beneath solar cell 102. In one embodiment, a selective etchant comprising hydrofluoric acid is used. Solar cell 102 is suspended over and attached to the monocrystalline silicon body of substrate 202 by polysilicon-filled anchors 208. In addition, in some embodiments, solar cell 102 may be attached to at least one adjacent photovoltaic solar cell by polysilicon-filled posts 210. Because solar cell 102 is suspended, more surfaces of solar cell 102 are exposed for passivation. Passivation layer 212, of silicon nitride, silicon dioxide, aluminum oxide, or a combination thereof, can therefore cover not just the bottom surface of solar cell 102 being formed, but also the sidewalls and the top surface.

In one embodiment, at least one wraparound junction is created. After etching away the oxide layer, phosphorous-containing glass is deposited into the annular trench through the monocrystalline silicon layer and phosphorous is thermally diffused from the phosphorous-containing glass into exposed portions of photovoltaic solar cell 102 being formed, thereby extending p-type-doped regions 204 to wrap around and at the top surface of solar cell 102 being formed, which is at the undercut surface of solar cell 102. In this embodiment, passivation layer covers regions 204 over the wraparound junctions as well.

Next, electrical connections are formed for the doped regions. Openings are etched through passivation layer 212 at locations of n-type-doped regions 206 and locations of p-type-doped regions 204. A set of electrical contacts 214 (e.g., electrodes) are deposited over the etched passivation layer 212 to form electrical connections to each of n-type-doped regions 206 and another set of electrical contacts 216 are deposited over the etched passivation layer 212 to form electrical connections to each of p-type-doped regions 204.

After solar cell 102 is formed, it can be detached from the remainder of the substrate 202. In one embodiment, solar cell 102 may be detached from substrate 202 using receiving substrate 218. Receiving substrate 218 may be attached to the bottom surface of solar cell 102, which may also be referred to as a metallized side of solar cell 102 because this is the side of solar cell 102 having electrical contacts 214 and 216. When receiving substrate 218 is lifted, solar cell 102 remains attached to receiving substrate 218 causing anchors 208 connecting solar cell 102 to substrate 202 to sever and release solar cell 102 from substrate 202. In some embodiments, solar cell 102 may be removed from substrate 218 so that electrical contacts 214, 216 may be used to electrically connect solar cell 102 to, for example, a photovoltaic solar cell concentrator. Alternatively, where receiving substrate 218 includes a conductive material that can be electrically connected to electrical contacts 214, 216, receiving substrate 218 does not need to be removed from solar cell 102.

For example, in one embodiment, receiving substrate 218 may be an adhesive material such as an adhesive tape. The adhesive tape may adhere to the bottom surface or metallized side of solar cell 102 (and any other solar cells attached to substrate 202). Adhesive tape has an adherence property such that it will adhere to a bottom surface of solar cell 102. Lifting of the adhesive tape lifts solar cell 102 and removes solar cell 102 (and any other cells) from substrate 202. It is further noted that if multiple solar cells are fabricated together, the adhesive material may be expanded (e.g., stretched) to sever any posts that may be used to attach the solar cells to each other, thus separating the cells from each other on receiving substrate 218. The adhesive tape can then be removed from the metallized side of solar cell 102 prior to incorporation of solar cell 102 into a solar cell module. For example, a second adhesive tape (not shown) having a greater adhesive force than first adhesive tape 218 can be attached to the side of solar cell 102 opposite the side attached to the first adhesive tape 218. When first adhesive tape 218 and the second adhesive tape are pulled apart, solar cell 102 remains attached to the second adhesive tape and the metallized side of solar cell 102 is exposed so that electrical connections can be made at electrical contacts 214, 216.

Figure 3:
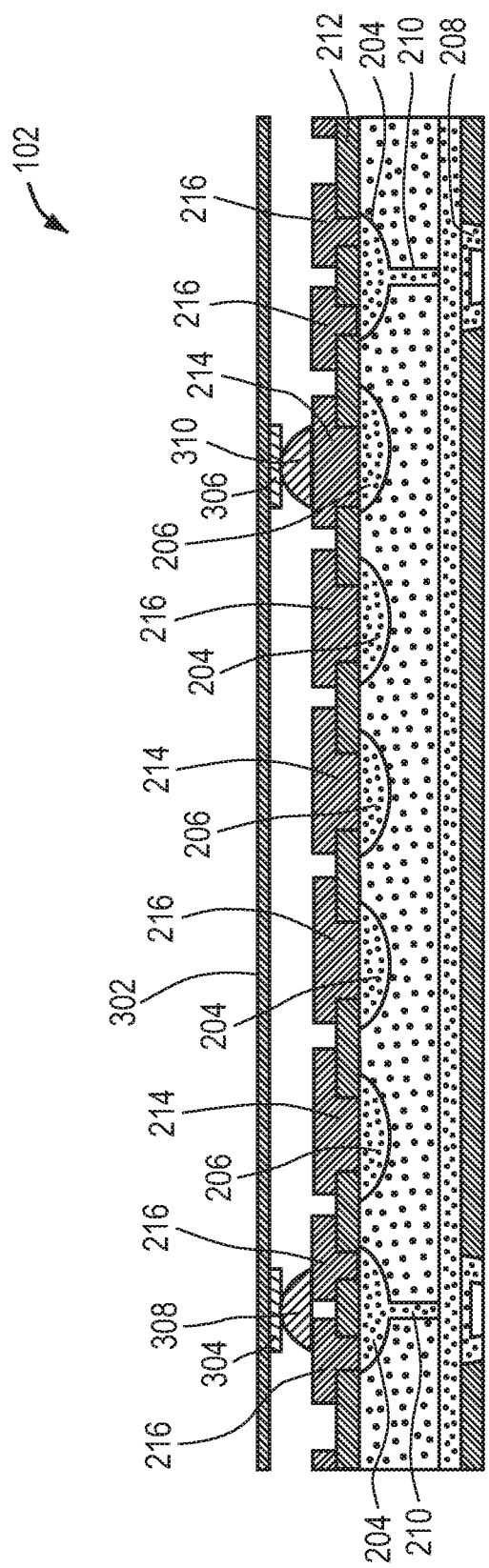
FIG. 3 shows a schematic cross-section view of a photovoltaic solar cell attached to a receiving substrate.

FIG. 3 shows a schematic cross-section of the solar cell illustrated in FIG. 2 attached to a receiving substrate including a conductive material. Solar cell 102 is shown removed from wafer 202 (see FIG. 2) and attached to receiving substrate 302. In one embodiment, receiving substrate 302 may be a substantially flexible polymer having metal contacts 304, 306 formed therein, such as, for example, a flexible circuit. It is noted that although receiving substrate 302 is primarily described as a flexible material herein, it is contemplated that receiving substrate 302 may also be a rigid material depending upon the application. Solar cell 102 is bonded to receiving substrate 302 with connecting members 308, 310. Connecting members 308, 310 may be any type of conductive bump made of, for example, a metal material that can be melted and then cooled to bond solar cell 102 to receiving substrate 302. Representatively, connecting members 308, 310 may be solder bumps or electroplated bumps which include a metal material (e.g., metal alloy, titanium, indium or the like) and are applied by any standard processing technique. Still further, a printing or screen-printing technique may be used to form connecting members 308, 310.

In some embodiments, connecting members 308, 310 are applied to the metallized surface of solar cell 102 and then aligned with metal contacts 304, 306 of receiving substrate 302. In other embodiments, connecting members 308, 310 are applied to metal contacts 304, 306, respectively, of receiving substrate 302 and then receiving substrate 302 is aligned with the metallized surface of solar cell 102. In either case, it is desirable for connecting members 308, 310 to be aligned with metal contacts 304, 306 of receiving substrate 302 and electrical contacts 214, 216 of solar cell 102 so that a conductive pathway is formed between receiving substrate 302 and solar cell 102.

Although two connecting members 308, 310 are illustrated in FIG. 3, it is contemplated that any number of connecting members may be used to connect solar cell 102 to receiving substrate 302. In addition, connecting members 308, 310 may be positioned at different points on solar cell 102. The number and positioning of connecting members 308, 310 may vary depending upon the size of solar cell 102 and desired level of flexibility of the final solar cell module. For example, in the case of a larger solar cell 102, two connecting members positioned at opposite points (e.g., opposite corners) on solar cell 102 may be used to connect solar cell 102 to substrate 302 in order to maintain flexibility of the final solar cell module. The positioning of connecting members 308, 310 need only be constrained by the requirement that one or more connecting members 308, 310 interconnects at least one of electrical contact 214 and at least one of electrical contact 216 on solar cell 102 with at least one of metal contacts 304, 306 of receiving substrate 302.

In some embodiments, due to the flexibility of receiving substrate 302, it may be difficult to maintain alignment between electrical contacts 214, 216 of solar cell 102 and metal contacts 304, 306 of receiving substrate 302. For example, where receiving substrate 302 is a flexible circuit and metal contacts 304, 306 are printed wires, the wires may flex and bend causing a misalignment. Therefore, in some embodiments, S shaped wires may be formed within the flexible circuit so that an extra length of wire is positioned between the connecting members 308, 310. This extra length allows for expansion (or straightening) of the wire without modifying a position of the wire within the flexible circuit at points where connecting members 308, 310 are attached.

Once receiving substrate 302 and solar cell 102 having connecting members 308, 310 in between are aligned, heat at a sufficient temperature to reach a flow temperature of connecting members 308, 310 (e.g., about 90 degrees Celsius to about 450 degrees Celsius) is applied to melt connecting members 308, 310. Connecting members 308, 310 are then cooled to bond receiving substrate 302 to solar cell 102. Due to the conductive pathway formed between solar cell 102 and receiving substrate 302, the function of the metallized side of solar cell 102 is not inhibited by receiving substrate 302. As such, a solar cell module for use in the final product (e.g., electronic device 504) can be formed with solar cell 102 having receiving substrate 302 attached thereto.

Figure 4A:
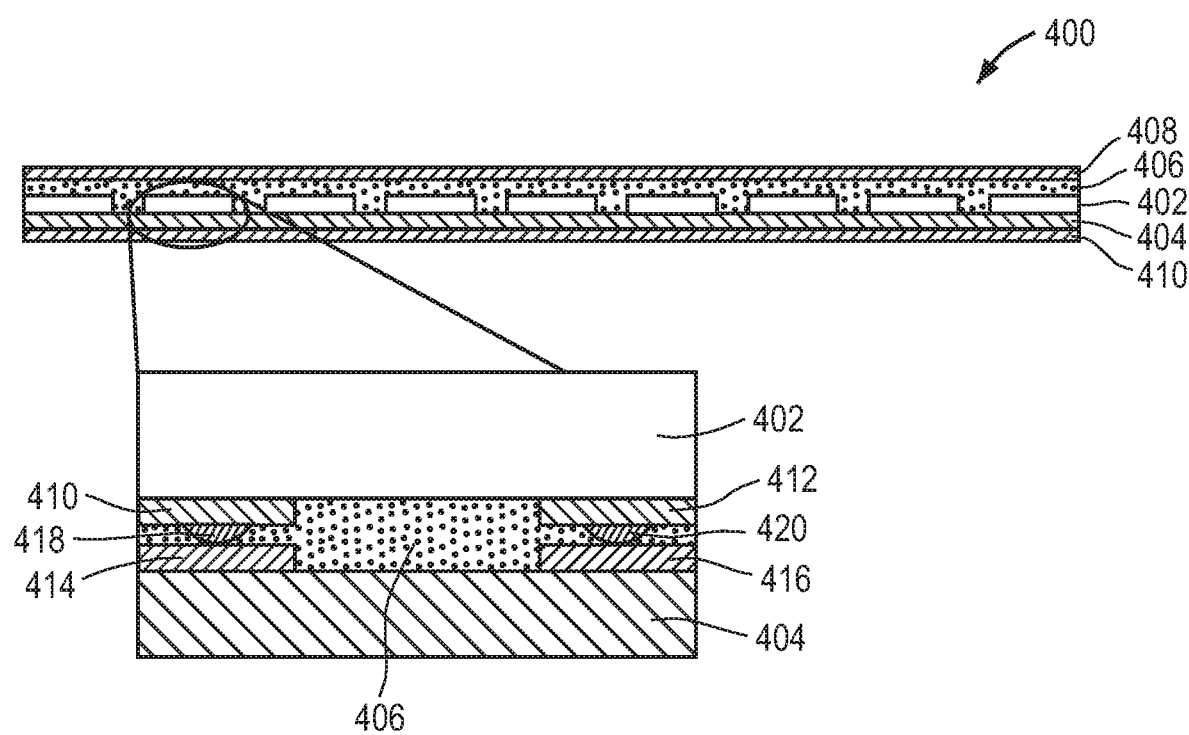
FIG. 4A shows a schematic cross-section view and exploded view of a solar cell module.

FIG. 4A illustrates a schematic cross-section view of a solar cell module and an exploded view of one of the solar cells in the module. Solar cell module 400 may include a plurality of solar cells 402 attached to receiving substrate 404. Each of solar cells 402 may be substantially similar to solar cell 102 described in reference to FIG. 3 and receiving substrate 404 may be substantially the same as receiving substrate 302 described in reference to FIG. 3. Solar cells 402 may be attached to receiving substrate 404 as previously discussed (e.g., using solder bumps). In addition, a layer of fill material 406 may be applied over solar cells 402 to permanently attach solar cells 402 to receiving substrate 404. Fill material 406 may be any material suitable for permanently attaching solar cells 402 to receiving substrate 404 and have flexible and/or moldable properties. For example, fill material 406 may be a polymer material, such as a thermoplastic or a thermoset such as a polyimide. In one embodiment, fill material 406 may be EVA or polydimethylsiloxane (PDMS). Fill material 406 may be applied according to any standard processing technique.

To finalize solar cell module 400, first film 408 may be applied over the layer of fill material 406. An optional second film 410 may be applied to the exposed side of receiving substrate 404. It is contemplated, however, that in some embodiments, second film 410 may be omitted. First film 408 and second film 410 may be any type of flexible sheet material made of, for example, a polymer, plastic, flexible glass, or the like. It is further desired that first film 408 and optional second film 410 be made of a moldable material. Representatively, either one or both of first film 408 and second film 410 may be made of a Kapton® polyimide film available from DuPont. It is further contemplated that either one or both of first film 408 and second film 410 may be made of the same material as fill material 406. The resulting solar cell module 400 is flexible and, due in part to the moldable fill material 406, film 408 and optional film 410, may be molded into a three-dimensional shape.

The exploded view in FIG. 4A illustrates the attachment of one of solar cells 402 to receiving substrate 404. From this view, it can be seen that solar cell 402 includes electrical contacts 410, 412 aligned with metal pads 414, 416, respectively, of receiving substrate 404. Connecting members 418, 420 attach electrical contacts 410, 412 to metal contacts 414, 416, respectively. To permanently secure solar cell 402 to receiving substrate 404, fill material 406 is applied between solar cell 402 and receiving substrate 404. Fill material 406 also fills in gaps around connecting members 418, 420. Although an exploded view of only one of solar cells 402 is illustrated, each of solar cells 402 are attached to receiving substrate 404 in a similar manner.

The resulting product is a flexible solar cell module 400 having a plurality of solar cells encapsulated between flexible sheets. The term "flexible" or "flexibility" as used herein refers to the ability of solar cell module 400 to bend, as opposed to a rigid structure which does not bend in its natural state. As such, the flexibility of solar cell module 400 may be defined by a bend radius of from about 0.75 mm to about 10 mm, for example, from about 3 mm to about 7 mm, or from about 5 mm to about 6 mm. Such a small bend radius may be attributed in part to the dimensions and positioning of solar cells 402 within solar cell module 400 as well as the overall thickness of solar cell module 400. Representatively, as previously discussed, solar cells 402 may have a thickness of, for example, less than about 50 µm and preferably from about 5 to about 10 µm. As such, an overall thickness of solar cell module 400 remains small, for example, less than about 0.5 mm, for example, from about 0.2 mm to about 0.4 mm. In addition, each of solar cells 402 have a thickness of less than 50 µm and may have lateral dimensions of, for example, up to about 1 mm. The smaller the thickness and lateral dimensions of solar cells 402, the smaller the bend radius will be. Placing the less compliant components (i.e., solar cells and conductive metal contacts) at or near the neutral bend plane of the assembly will enable smaller bend radii.

Figure 4B:
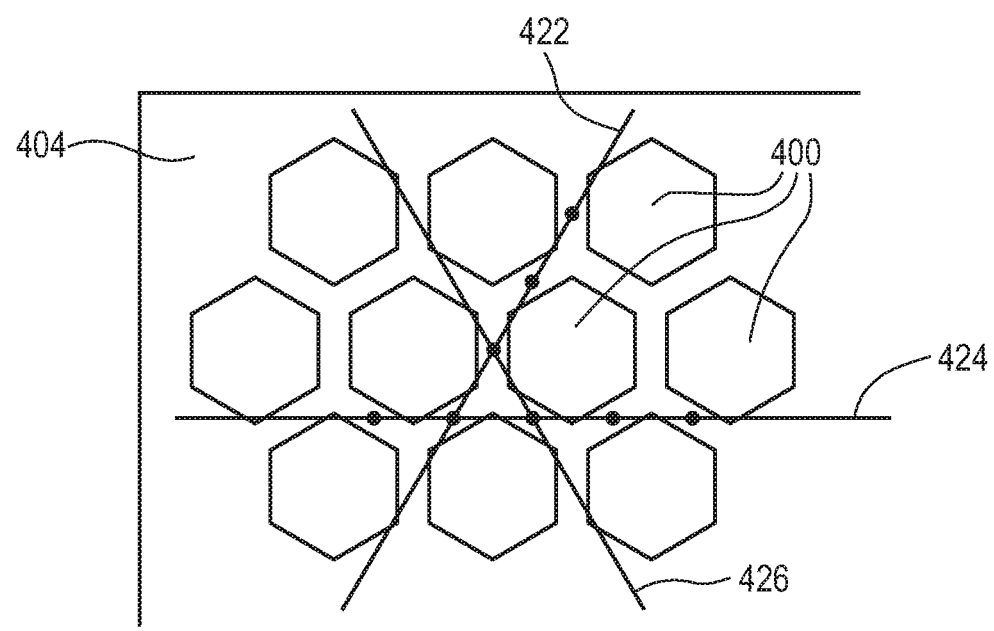
FIG. 4B shows a schematic top view of an arrangement of solar cells within the solar cell module of FIG. 4A.

In addition, the polygonal shape (e.g., hexagonal or square) and small lateral dimensions of solar cells 402 allow for bending of solar cell module 400 in a variety of directions. For example, solar cells 402 may be arranged within solar cell module 400 in a side by side honeycomb like pattern such that each of the side walls of solar cells 402 may be juxtaposed with a sidewall of an adjacent solar cell as illustrated in FIG. 4B. Fill material 406, first film 408 and second film 410 are omitted from FIG. 4B so that the arrangement of solar cells 400 within solar cell module 400 can be seen. Since each of solar cells 402 are independently attached to receiving substrate 404 and may have length and width dimensions of less than 1 mm, solar cell module 400 may flex or bend at multiple points around and between solar cells 402 as illustrated by lines 422, 424, 426 and the exemplary points indicated along lines 422, 424, 426. Solar cell module 400 may bend in multiple directions, for example along an axis formed by lines 422, 424, 426 or an axis formed perpendicular to lines 422, 424, 426 at the illustrated points. The bend radius along one or more of the illustrated axes may be substantially equivalent. The close proximity of these bend points (e.g., 1 mm apart) along all sides of solar cells 402 helps to maintain the flexibility and small bend radius of solar cell module 400. For example, if the bend points were spaced large distances from one another, as may be the case with solar cells having a length substantially greater than their width, the bend radius of the module would be substantially increased, and in some cases prevented along the length dimension of the solar cells. Although a flexible solar cell module 400 is described, it is further contemplated that in some embodiments the solar cell module may be a substantially rigid structure. For example, where solar cells 402 are attached to a rigid receiving substrate 404, solar cell module 400 may form a rigid module structure.

Figure 5A:
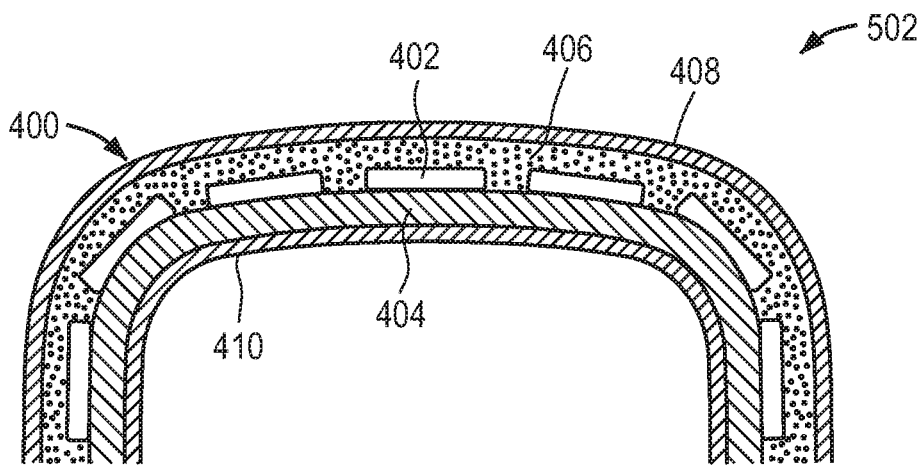
FIG. 5A show a schematic cross-section view of the solar cell module of FIG. 4 in a molded configuration.

Given the flexibility of solar cell module 400 and the materials used to encapsulate solar cells 402 within module 400 (e.g., moldable fill material 408, first film 408 and second film 410), solar cell module 400 may be molded into a variety of shapes having different sizes and dimensions. It is to be understood that, in some embodiments, molding of solar cell module 400 changes solar cell module from a first configuration (e.g., substantially planar configuration of FIG. 4A) into a second configuration, for example, an arch shaped casing 502 as illustrated in FIG. 5A. The second configuration may have a different shape or form than the first configuration of solar cell module 400. In some embodiments, the first configuration may be a substantially flexible structure (e.g., have a bend radius of from about 0.75 mm to about 10 mm) and the second configuration may be a substantially rigid structure. In this aspect, molding of solar cell module 400 may modify solar cell module 400 from a flexible configuration to a rigid configuration. Alternatively, the second configuration may have some flexibility but less flexibility than the structure formed by the first configuration, for example the structure formed by the first configuration may have a bend radius of from about 0.75 mm to about 10 mm and the structure formed by the second configuration may have a bend radius greater than 10 mm. Still further, the first configuration may be a rigid structure and the second configuration may also be a rigid structure. Additionally, the shape of the molded solar cell module (i.e., second configuration) may be independently maintained by the solar cell module. In other words, a user or additional materials are not necessary to hold solar cell module in the second configuration.

Figure 5B:
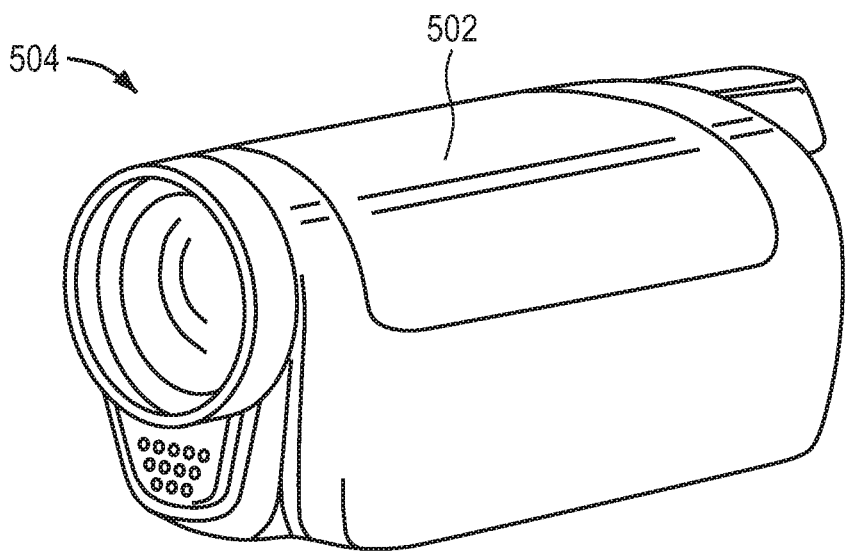
FIG. 5B shows a perspective view of an application of the molded solar cell module of FIG. 5A.

Casing 502 may be incorporated into handheld camcorder 504 as illustrated in FIG. 5B to give camcorder 504 photovoltaic functionality. Although an arch shaped casing 502 used in camcorder 504 is illustrated in FIGS. 5A and 5B, it is contemplated that solar cell module 400 may be molded into a part suitable for use in a variety of structures, for example, a personal electronic device, outdoor gear, military gear, outdoor furniture, tiles, building integrated materials, cars, boats, planes or any other device that could benefit from solar power.

Figure 6:
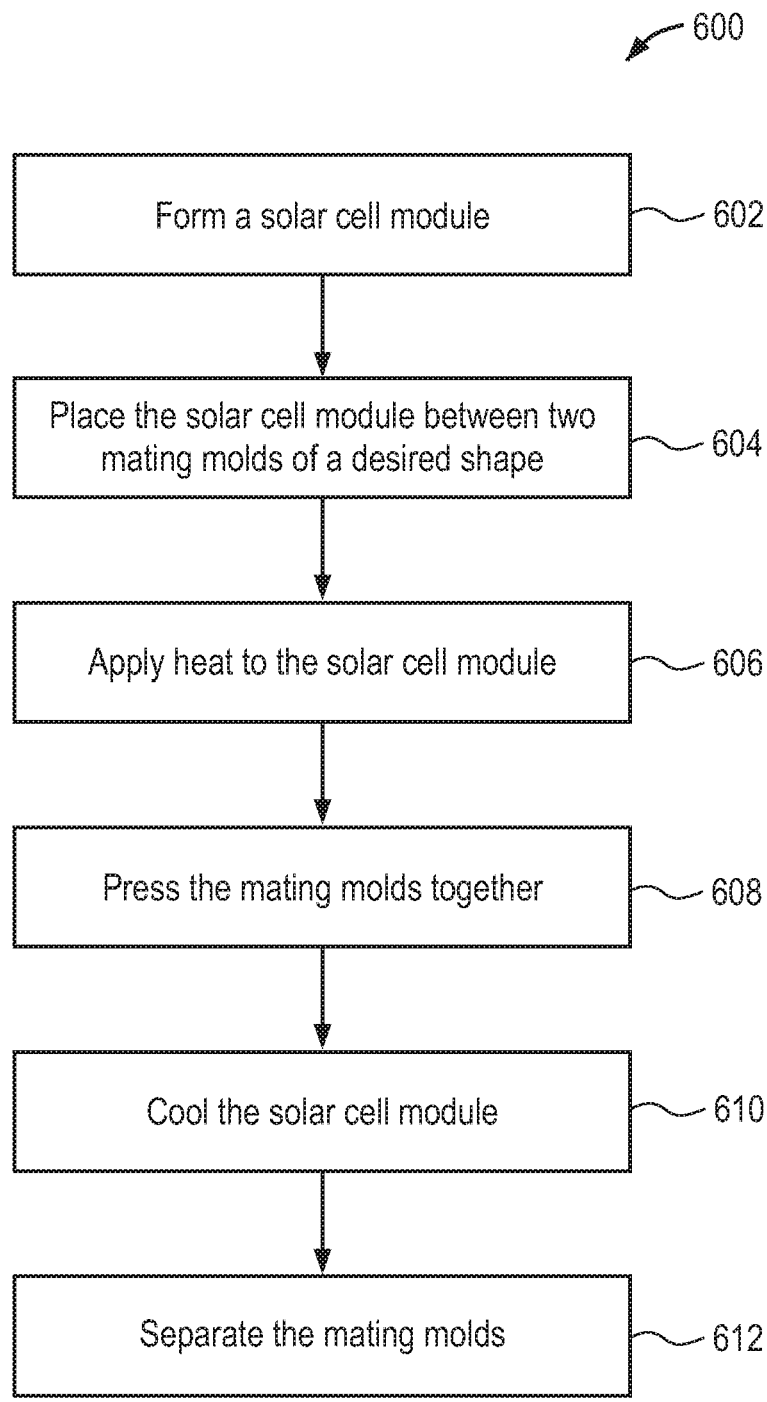
FIG. 6 shows a flow chart of a process for molding a solar cell module.

FIG. 6 illustrates a flow chart of an embodiment of a process for molding a solar cell module into a desired shape. In some embodiments, molding process 600 may be a compression molding process, although any other suitable process for molding a solar cell module into a desired shape may be used. For example, a thermoforming or vacuum forming process may be used in which the solar cell module is held onto a single-surface mold by applying a vacuum force between the mold surface and the solar cell module. In one embodiment, molding process 600 may include forming a solar cell module (block 602) such as solar cell module 400 disclosed in reference to FIG. 4A. The solar cell module may then be placed between two mating molds into a mold cavity having the desired molded product shape (e.g., a casing for an electronic device) (block 604). In some embodiments, an additional moldable material may be positioned between the mating molds and molded to the solar cell module. For example, the additional moldable material may be a polymeric material or a plastic material such as a thermoplastic including, but not limited to, polyethylene, polypropylene, polystyrene, polyvinyl chloride and polytetrafluoroethylene (PTFE). Still further, the additional moldable material may be any moldable material typically used to form parts for the desired product, for example, a metal or a glass. The moldable material may be added to help hold the molded shape of the solar cell module and/or to add thickness to the final product. For example, where the solar cell module is used to form a camcorder casing as previously discussed, it may be desirable to mold the solar cell module with a plastic material in order to create a plastic casing having a thickness greater than the solar cell module alone (i.e., greater than 0.5 mm).

Once the solar cell module is in place within the mold, the solar cell module is heated (block 606). The solar cell module may be heated to a temperature sufficient to melt the moldable fill material within the solar cell module (e.g., EVA or PDMS) and an outer film (i.e., film 408) without damaging the solar cell module. Representatively, where the solar cell module includes solder bumps as previously discussed, the temperature should be below a melting temperature of the solder bumps so as not to destroy the solar cell module. Heat may be applied using any technique and over any period of time suitable for heating a solar cell module without destroying the photovoltaic functionality of the module. The mating molds are pressed together, for example by a hydraulic ram, to conform the solar cell module to the desired shape (block 608). Once the desired shape is achieved, the solar cell module is cooled (block 610) and the mating molds are separated (block 612) to reveal a product or product part of the desired shape. Due to the flexibility and small bend radius of the solar cell module, products or parts of products having a variety of shapes and sizes, including narrowly curved parts, can be formed.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

Features that Facilitate Moldability

A distinguishing feature of a module that is moldable in contrast to merely flexible is that a moldable module can be formed to a three-dimensional shape that is arbitrary to within a certain minimum bend radius. In fact, a moldable module need not be flexible at room temperature. Although it might desirably include flexible components, such as a flex-circuit backplane, the entire assembly could also include, e.g., a rigid but thermoformable backing plate or backing film and a similar cover plate or cover film.

According to one convenient way to characterize how moldable a module is, the radius is specified for the smallest hemisphere that is achievable by molding the module. We believe that the techniques described here can achieve a hemisphere radius of ten centimeters or even less. Ten centimeters is desirable because features on that scale characterize many of the objects encountered in daily life. Of course, shapes with bend radii greater than ten centimeters, and even up to several meters or even more, will also have useful applications.

Accordingly, one of our objectives is to provide a photovoltaic module that can be thermoformed into a three-dimensional shape that, at least at one point, is bent about at least two non-parallel axes with a radius of curvature about each of said axes that is in the range 10-100 centimeters. Another of our objectives is to provide an article comprising a photovoltaic module that has been thermoformed in such a manner.

In order to achieve bend radii as small as ten centimeters, it is desirable for the individual photovoltaic cells to be no more than one centimeter in lateral dimensions. It should be noted in this regard that preferred cells for such applications are silicon single-crystal cells or other single-crystal cells. Single-crystal cells are generally much more rigid than amorphous silicon cells. Hence most of the flexibility and moldability of the assembled module is attributable to the deformation of the films and fill material, and not to the bending of the cells themselves.

That is not to say, however, that amorphous cells and non-silicon cells such as III-V cells are excluded. On the contrary, it is expected that amorphous and non-silicon cells will also find application in implementations of our ideas for moldable photovoltaic modules.

To allow for the greatest and most uniform flexibility, it is advantageous for the cells to take the form of regular hexagons or equilateral triangles, and for the cells to tessellate the backplane in a triangular or hexagonal array. Gaps between cells are useful to increase the flexibility and to provide more intercell area over which to distribute the bending strain. However, increasing the gap width decreases the coverage ratio, which decreases the power-generating ability of the array. Hence it is preferable to use the smallest gap width that is compatible with the mechanical demands that the module must satisfy.

It should be noted in this regard that large coverage ratios, i.e., coverage ratios approaching 100%, are preferable because the arrangements envisaged here do not include lenses or other solar concentrators paired with the individual cells.

As explained above, the photovoltaic module includes a backplane, referred to above as receiving substrate 404, that has wiring (i.e., circuit paths) printed on it, including solder pads or other bonding areas for the back-surface contacts of the photovoltaic cells. (A flexible backplane that includes printed wiring is also referred to herein as a "flex-circuit".) In illustrative examples, the substrate material for the backplane is a polyimide sheet.

It was mentioned above that it is useful to include sigmoid bends in the printed wiring in order to make the wiring more able to take up the strain induced by bending of the backplane. Printed wiring, in this regard, means any pattern of conductors applied by any technique to the backplane for the purpose of interconnecting the individual photovoltaic cells, interconnecting groups of photovoltaic cells to each other, and providing output.

More generally, the printed wiring can be made more robust against bending of the backplane if it is not laid out in straight segments between contact pads or the like, but is instead laid out in a meandering pattern. By "meandering pattern" is meant any pattern that includes loops, bends, or turns that increase the length of the wiring between pairs of connection points, relative to straight line segments between points of connection.

A special case of a meandering pattern is a serpentine pattern in which a conductive trace follows two or or more consecutive arcs. For at least some applications, a meandering pattern will be advantageous if it extends the lengths of the conductive traces by at least 10% relative to straight line segments.

Figure 7:
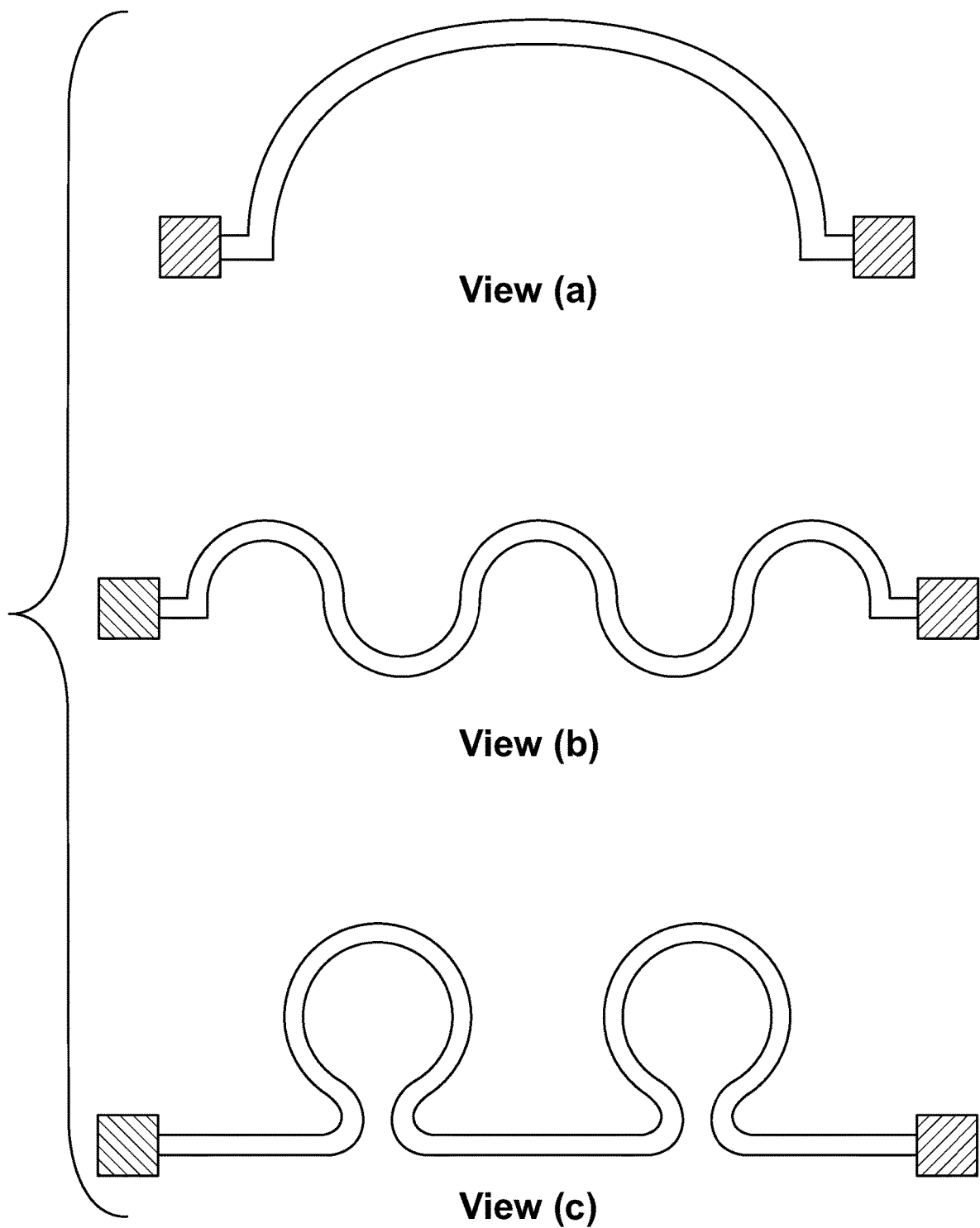
FIG. 7 shows examples of meandering conductor patterns useful in embodiments of the present invention.

FIG. 7 provides three examples of meandering conductor patterns, respectively corresponding to views (a), (b), and (c) in the figure. Views (b) and (c) provide examples of meandering patterns.

Figure 8:
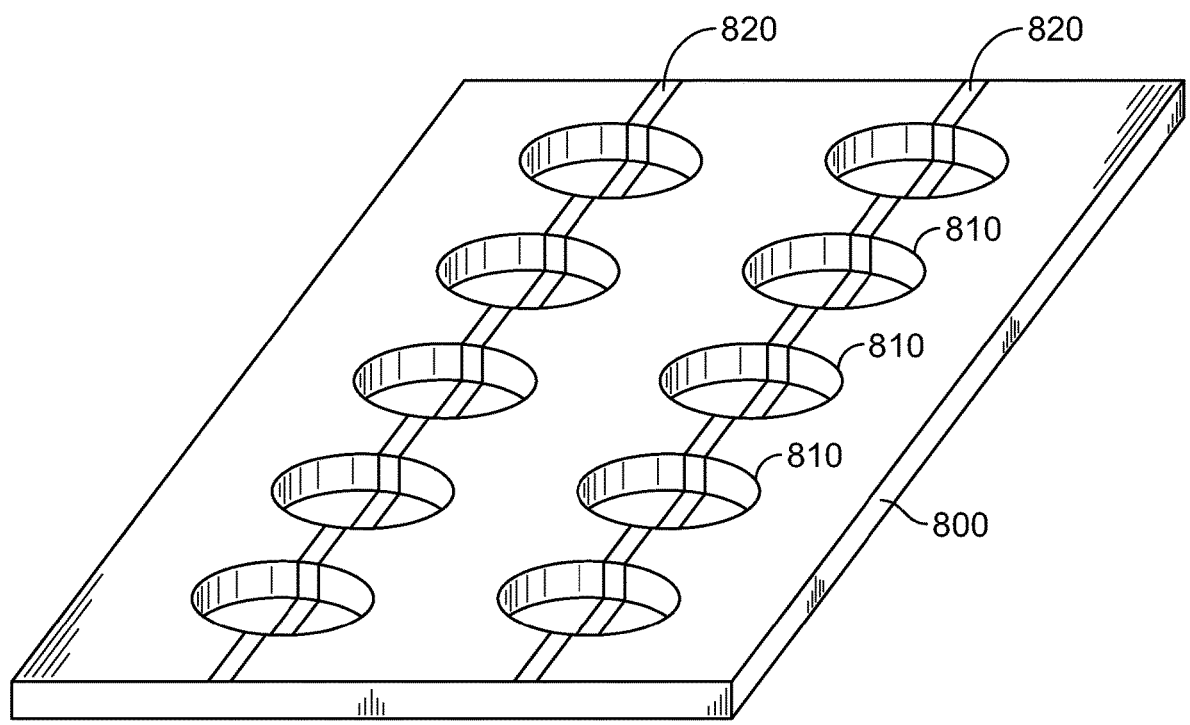
FIG. 8 shows an example of a dimpled flex-circuit useful in embodiments of the present invention.

Another possible way to increase the flexibility of the module, illustrated in FIG. 8, is to emboss the backplane 800 with an array of dimples 810, and to deposit the printed wiring 820 in a pattern that runs across the dimples. The wiring pattern may optionally be a meandering pattern, but even if it is laid out in straight segments (as seen in plan view), the portions of the wiring that deviate vertically because they descend into and rise out of the dimples may provide greater robustness against bending.

Figure 9:
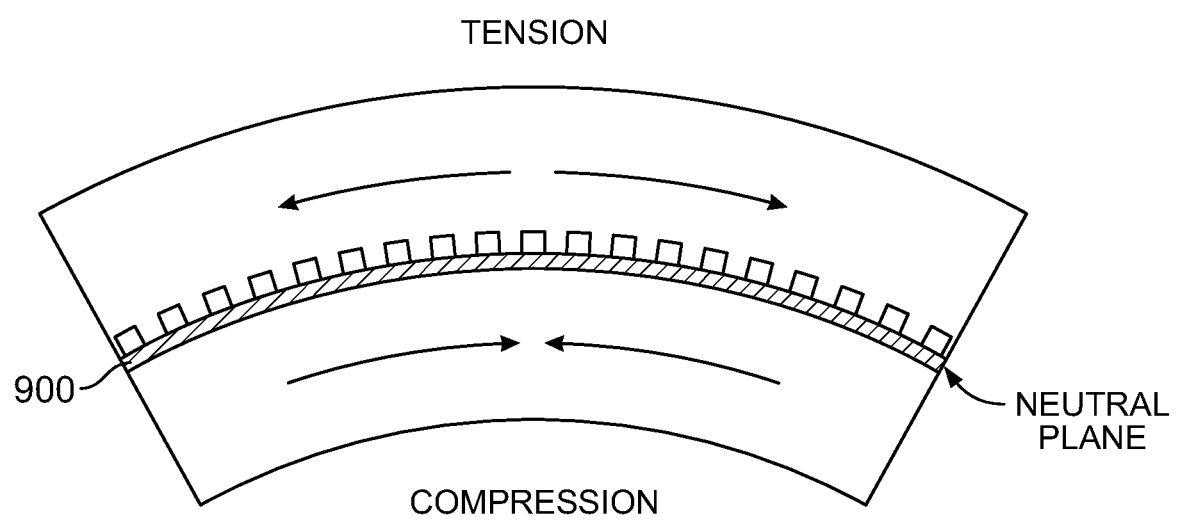
FIG. 9 shows a placement of the flex-circuit substrate in the neutral bend plane of a photovoltaic solar panel assembly.

To minimize the bending-induced strain on the printed wiring, it is also desirable to place the backplane, and in particular the printed side of the backplane, in the neutral bend plane of the assembled module or as close to the neutral plane as practicable. FIG. 9 illustrates such a placement of the backplane 900.

According to the example cell fabrication method that we have described above with reference to FIG. 2, which should be understood as exemplary and non-limiting, an SOI wafer is patterned with polysilicon anchors 208 in the oxide layer and polysilicon posts 210 in the monocrystalline silicon layer. The surface of the monocrystalline silicon layer is doped with a pattern of n-type and p-type dopants. Sidewalls are created for the cells by etching trenches through the monocrystalline silicon layer. A passivation layer 212 is applied to the exposed cell surfaces. The active areas of the monocrystalline silicon layer are undercut by etching away a portion of the underlying oxide layer. A passivation layer 212 is applied to the exposed cell surfaces.

It is desirable to passivate the cell surfaces, including the sides of the cells, to suppress surface recombination. Surface recombination is undesirable because it adversely affects performance characteristics of the cell such as open-circuit voltage and short-circuit current. Passivation has been described above.

One of the issues encountered in designing a moldable photovoltaic module is how to achieve thermal compatibility between the process of attaching cells to the backplane and the subsequent process of thermoforming the module. More specifically, reflow temperatures for lead-free solders typically used in the semiconductor industry are in the range 200-250° C.

This temperature range lies above the range in which many commonly used polymers soften. For example, typical forming temperatures are 163-177° C. for ABS, 177° C. for acrylic, 154-163° C. for CPVC, 118° C. for polyethylene LDPE, 146° C. for polyethylene HDPE, 154-163° C. for polypropylene, 118° C. for PVC, and 163-177° C. for styrene. Polyimide films typically soften enough for thermoforming in the range 200-400° C. Fluoropolymers typically soften or melt in a similar temperature range.

As a consequence, there is a need to select a solder whose melting point is low enough to avoid damage to the backplane, or to an underlying backing film if present, or to an adhesive layer, which may optionally be used to bond the backing film to the backplane. An example of a backing film is the "second film" 410 shown in FIGS. 4A and 5A.

However, if the melting point of the solder is too low, the solder joints can be damaged by heating during the subsequent thermoforming step. The contradictory requirements for a solder that melts without damaging the polymer films and at the same time remains solid during thermoforming places a severe constraint on the choices of both solder and polymer compositions.

We believe that this problem can be solved by using a variable-melting-point solder. Such a solder composition has a low initial melt temperature, but higher subsequent re-melt temperature. Compositions of that kind are known. Thus, for example we believe that without undue experimentation, it would be possible to find, for example, a tin/lead solder paste with an initial melt at about 183° C. and a remelt at about 250° C. (See for example U.S. Pat. No. 6,613,123, discussed below.) Such a combination of melt temperatures would permit a polyimide or other polymer film to be thermoformed without damaging the solder joints. Other variable-melting-point solder compositions would offer other advantageous temperature windows. In general, a temperature difference of at least 30° C. between the initial melt temperature and the remelt temperature is desirable in this regard.

By way of example, S. F. Corbin, "High-Temperature Variable Melting Point Sn-Sb Lead-Free Solder Pastes Using Transient Liquid-Phase Powder Processing," *J. Electr. Mat.* 34, Vol. 7 (2005) 1016-1025, the entirety of which is hereby incorporated herein by reference, reports a variable melting point solder paste of tin, 10 wt. % antimony, with an initial melting point of 232° C. and significant remelting only above 241° C.

Another example is provided by U.S. Pat. No. 6,613,123, which issued on Sep. 2, 2003 to S. M. Corbin et al. under the title, "Variable Melting Point Solders and Brazes," the entirety of which is hereby incorporated herein by reference. The abovesaid '123 patent describes variable melting point solder and braze compositions in which a metal or metal alloy powder having a low melting point is combined with a metal powder having a higher melting point. As reported there, a variable melting point solder in one embodiment comprised tin (Sn) powder mixed with a tin and bismuth (Bi) eutectic powder having a composition of 63 wt. % Sn:57 wt. % Bi such that the bulk composition of the mixture was 3 wt. % Bi. That solder had an initial melting point of 140° C. and a re-melt temperature of 220° C. after heating due to in situ alloying. Another embodiment was a composition of lead (Pb) powder mixed with a Pb-Sn eutectic powder having a composition of 62 wt. % Sn:58 wt. % Pb such that the bulk composition of the mixture was 15 wt. % Sn. That solder had an initial melting point of 183° C. and a re-melt temperature of 250° C.

U.S. Pat. No. 9,095,936, which issued Aug. 4, 2015 to D. J. McIsaac et al. under the title, "Variable Melting Point Solders," the entirety of which is hereby incorporated herein by reference, provides a further example. The abovesaid '936 patent provides several examples of variable temperature solder formulations. One example includes bismuth as a so-called "base metal" component, tin as a so-called "melting point depressant metal" component, and nickel as a so-called additive metal" component. As reported there, a solder paste was prepared from a nickel additive metal fraction of 20 wt. % of the total metals weight, 80 wt. % tin-bismuth eutectic powder, and a rosin-based flux. An initial process temperature of 160° C. melted the tin-bismuth eutectic alloy. In a subsequent reheating step, it was found that the solidus temperature of the solder had increased to more than 260° C.

Another example provided by the '936 patent comprises bismuth as the base metal, tin as the melting point depressant metal, and antimony as the additive metal. As reported there, the tin and bismuth formed a eutectic alloy of composition 42% Sn/58% Bi having a melting temperature of 139° C. Antimony was included as 30 wt % of the total metals weight, the eutectic alloy was included as 70 wt % of the total metals weight, and the powdered metals were combined with a rosin-based flux. An initial process temperature of 160° C. melted the tin-bismuth eutectic alloy. In a subsequent reheating step, it was found that the solidus temperature of the solder had increased to a value approaching 250° C.

Accordingly, some useful embodiments of our photovoltaic module include a flexible polymeric flex-circuit substrate, an electrically conductive printed wiring pattern defined on the flex-circuit substrate, and a plurality of solder pads defined on the flex-circuit substrate and electrically continuous with portions of the printed wiring pattern. Such an embodiment will also include a plurality of single-crystalline silicon photovoltaic cells, in which each of the cells has two back-surface electrical contacts that are affixed to and electrically continuous with respective solder pads. The flex-circuit substrate is optionally thermoformable. Although the flex-circuit substrate need not be thermoformable, the module also includes at least one further polymer sheet that is substantially parallel to the flex-circuit substrate and comprises a thermoformable polymer having a temperature range for thermoforming. Each solder pad is made using a solder composition that, after an initial melt, has a melting point that lies above at least a portion of the temperature range for thermoforming the polymer sheet or sheets. The solder composition is preferably a variable temperature solder composition selected to have an initial melting point that is less than the remelt temperature by at least 30° C.

Figure 10:
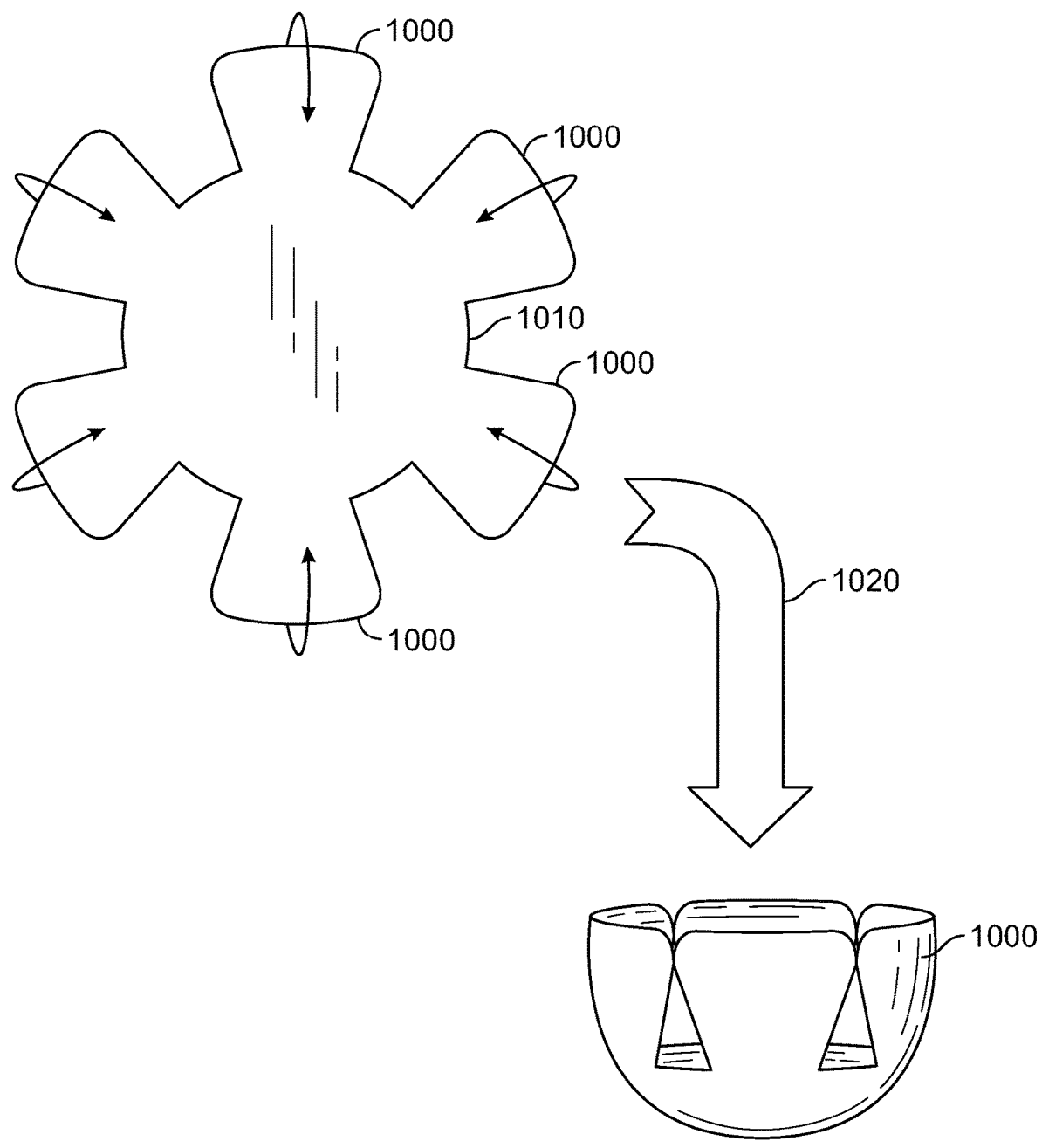
FIG. 10 is an illustration of gore panels, which are useful in embodiments of the present invention.

Another one of the issues encountered in designing a moldable photovoltaic module is how to mold a workpiece, initially provided as a flat module, into a curved shape without buckling or wrinkling the workpiece. This is especially important in instances in which the backplane is not formable, or is not thermoformable at the thermoforming temperatures of top and/or bottom films to which it is joined. In experiments, we have found that this problem can be solved by initially providing the workpiece with gore panels before it is placed in the mold. As shown, e.g., in FIG. 10, a gore panel 1000 is a geometrical feature of a sheet-like object 1010 that permits separated edges of the object to be joined or nearly joined when the object is reshaped 1020 from a generally planar configuration to a curved configuration.

A familiar example of gore panels is provided by the well-known Goode homolosine projection of the earth. The orange-peel segments of that planar projection permit it to be wrapped around a spherical form to approximately recreate a globular terrestrial map.

A gore panel may be thought of as a projecting finger of material whose edges will approach or join other similarly projecting fingers of material when the workpiece is formed into a three-dimensional surface.

The layout for gore panels that facilitate the molding of a photovoltaic panel into a particular product shape can readily be ascertained using various techniques such as those of cartographic projection and computer-aided design.

In an example implementation, gore panels are included in the conformation of the flex-circuit substrate. The flex-circuit substrate is sandwiched between two layers of a film adhesive, and that assembly is sandwiched, in turn, between top and bottom thermoformable sheets. (An optional fill material can replace the top layer of film adhesive.) The complete assembly is placed in a mold for thermoforming, where the adhesive films and the top and bottom thermoformable sheets soften and flow during the forming process. In the reshaping that takes place during the forming process, edges of the gore panels that would mate in a perfect reconstruction of a three-dimensional surface are brought near each other and sealed in place by the flowable materials.

As noted above, the gore panels can be designed into the workpiece ab initio, or they can be provided later, exemplarily by cutting. Especially for lower-cost applications, it can be advantageous to provide uniformly manufactured photovoltaic modules that are subsequently adapted for specific applications by processes that include cutting out the gore panels. The resulting cuts might, however, interrupt or remove circuitry including photovoltaic cells and printed wiring. Hence it is desirable to design the modules according to an interconnection architecture that is very robust against the disablement or removal of portions of the circuitry.

Such an architecture has been described in U.S. Pat. No. 9,093,586, which issued to A. L. Lentine et al. on Jul. 8, 2015 under the title, "Photovoltaic Power Generation System Free of Bypass Diodes," the entirety of which is hereby incorporated herein. The abovesaid '586 patent describes a photovoltaic panel that is tolerant to partial shading without reliance on bypass diodes. (Bypass diodes are conventionally used to protect shaded photovoltaic cells from overloading by large currents produced by other cells that remain in sunlight.) The same adaptations that protect against such overload are also useful in the present context for protection against loss of function due to removal of portions of the module to define the gore panels.

Figure 11:
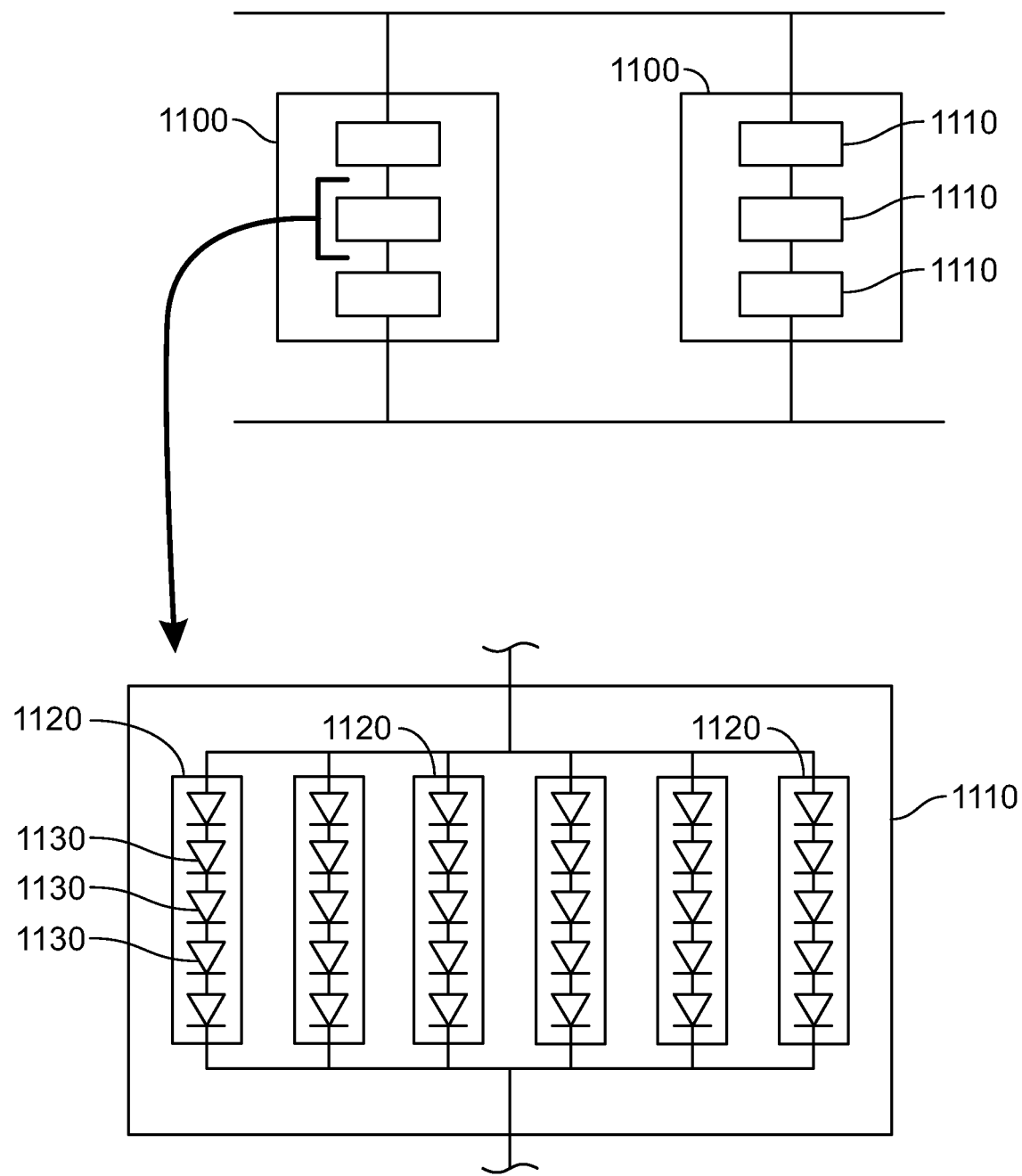
FIG. 11 is an illustration of an interconnection architecture for the cells of a solar panel that is robust against partial shading.

As described in the '586 patent an illustrated in FIG. 11, a solar panel in one embodiment is composed of a plurality of photovoltaic submodules 1100 that are connected in parallel. The submodules are small, exemplarily less than 30 cm in length and width. Each sub-module comprises a plurality of series-connected cell groups 1110. Each group comprises a parallel-connected plurality of cell strings 1120. Each string includes a plurality of cells 1130 connected in series. The resulting series-parallel-series-parallel arrangement of photovoltaic cells in the solar panel helps prevent the active cells from driving potentially destructive currents through individual cells that happen at a given time to be shaded. More specifically, the use of such an arrangement makes it unlikely that power dissipation across a single cell will not exceed a damage threshold, even if the cell is operating in a breakdown mode. Because only a modest amount of current is involved, the cell will generally be able to continue to operate in reverse breakdown for a long period of time.

To reiterate, the hierarchical elements of the above-described architecture are submodules, groups, and strings. Our moldable photovoltaic module can be designed according to a similar architecture. In an illustrative example, each submodule is laid out in a regular hexagon, and the resulting hexagons tile the surface of the module. The hexagonal submodules are interconnected in parallel by the printed wiring pattern on the backplane. (Various other tile shapes are possible, including equilateral triangles.)

Within each hexagonal submodule, a plurality of groups is laid out in an array and connected together in series. Each group can optionally be laid out in a regular hexagon or equilateral triangle. Either of these shapes is convenient for efficiently tiling the hexagonal submodule.

As described above, each group consists of a plurality of strings connected together in parallel. Each string consists of a plurality of cells connected together in series.

Figure 12:
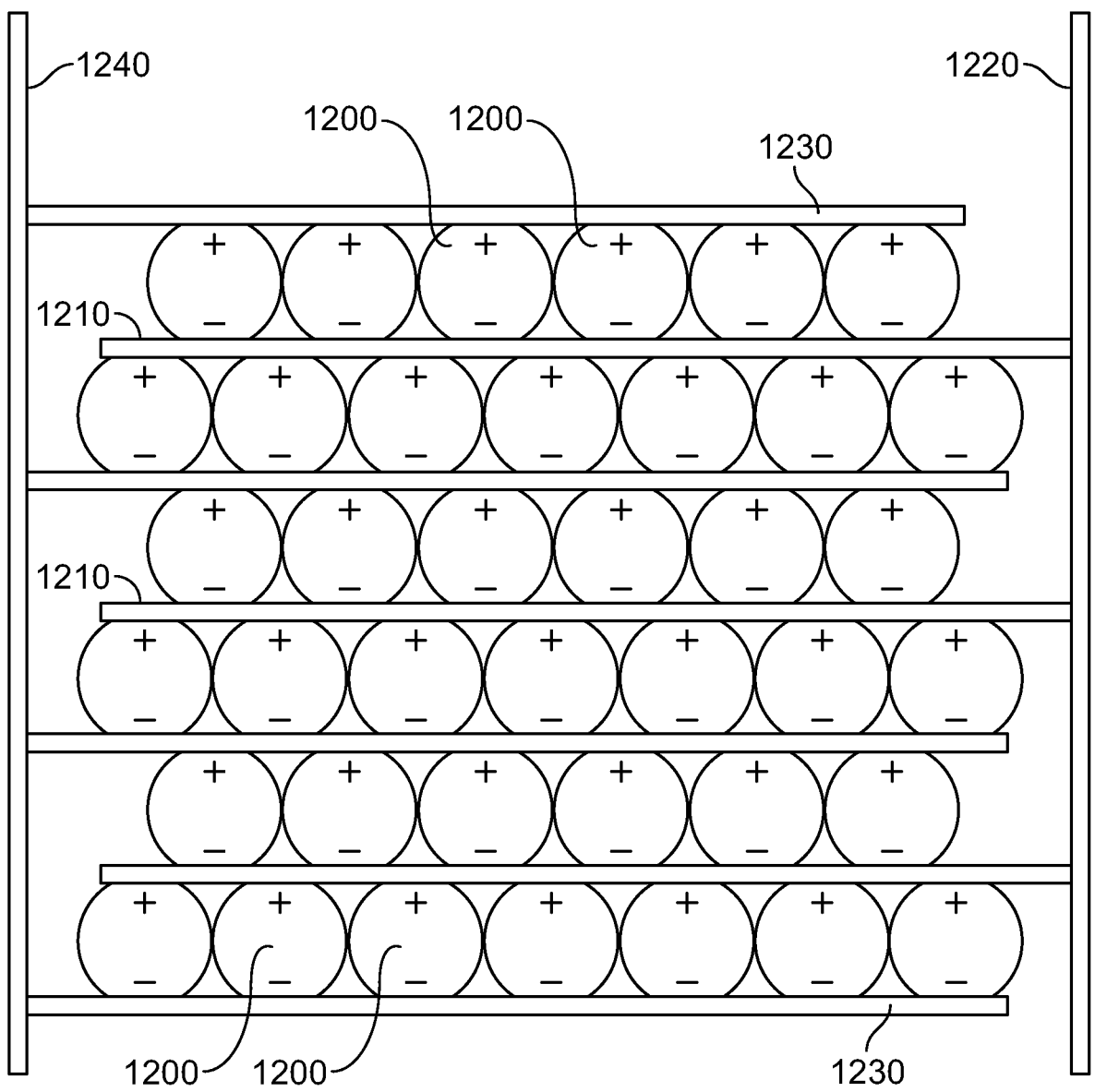
FIG. 12 is a schematic illustration of an example parallel wiring arrangement for submodules of a solar photovoltaic panel, according to some embodiments of the present invention.

Even if the full series-parallel-series-parallel arrangement is not used, just the tiling of the module with parallel-connected submodules will in many cases offer sufficient robustness against loss of functionality due to material removal. FIG. 12 provides one example of a possible parallel wiring arrangement for submodules 1200. The wiring arrangement that is illustrated uses negative-side busses 1210 and 1220 and positive-side busses 1230 and 1240 to interconnect the submodules.

The '586 patent was motivated, at least in part, by the problem of partial shading of photovoltaic panels. The same problem applies to our moldable panel. In fact, any molded shape that approximates half or more of a sphere will experience significant variations in illumination over its surface from direct sunlight, irrespective of its orientation. Both to address this problem and to assure that a sufficient number of intact submodule tiles remain after cutting out of gore panels, it is desirable to tile the module with a large number of submodule tiles, preferably ten or more.

Figure 13:
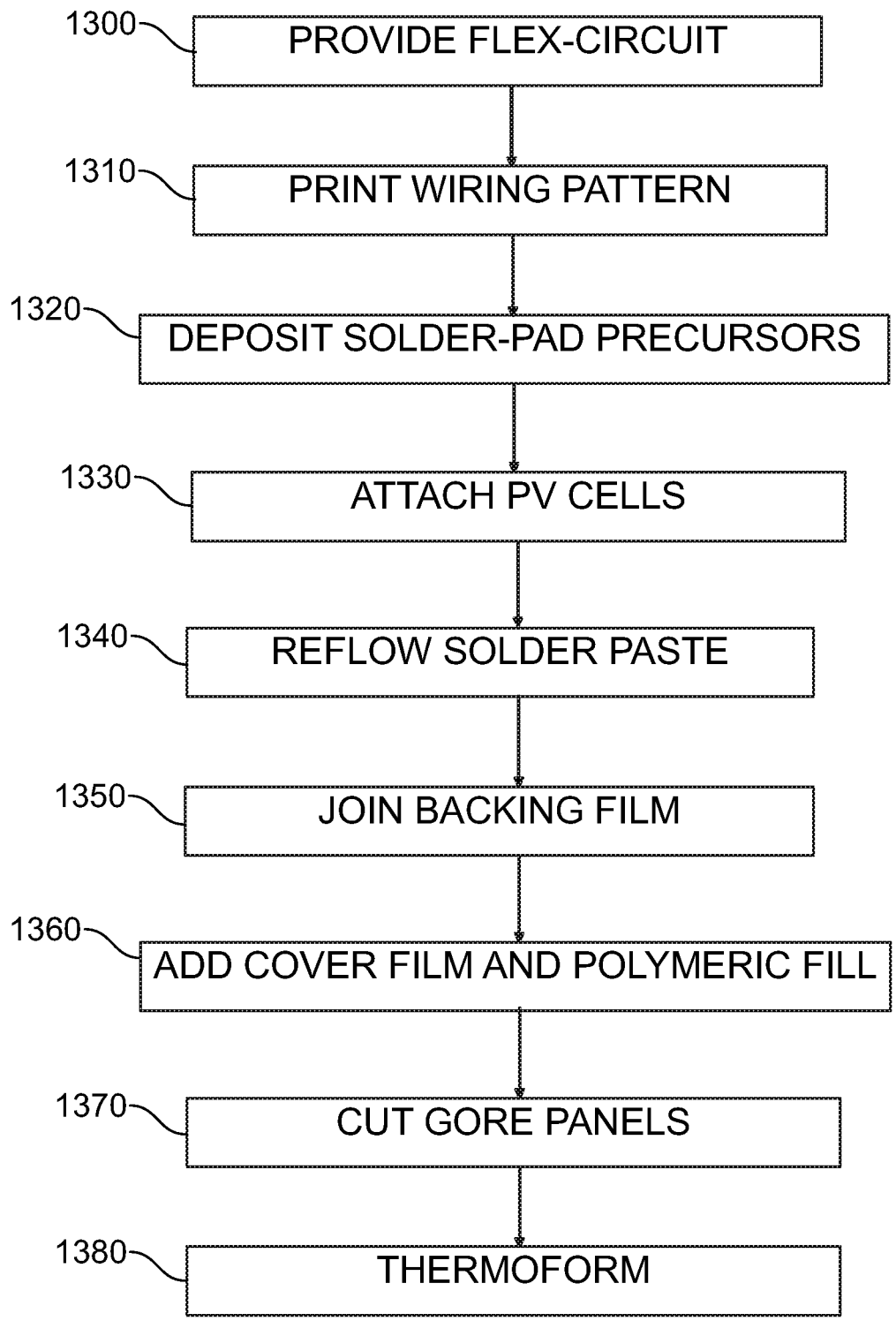
FIG. 13 is a flowchart of an assembly method according to some embodiments of the present invention.

An exemplary method utilizing the principles described above to make a moldable photovoltaic module article is illustrated in FIG. 13. The method begins with the step 1300 of providing a flexible polymeric flex-circuit substrate having top and bottom surfaces.

An electrically conductive printed wiring pattern is printed 1310 on the top surface of the flex-circuit substrate by known techniques. A plurality of solder-paste solder-pad precursors is deposited 1320 by known techniques on the flex-circuit substrate in electrical continuity with portions of the printed wiring pattern.

A plurality of photovoltaic cells, each having two back-surface electrical contacts, is added 1330 to the flex-circuit substrate by affixing each of the contacts to a respective one of the solder-pad precursors. A reflow 1340 of the solder paste of the solder-pad precursors is performed at a reflow temperature, resulting in the formation of solder pads. The solder paste has a variable-temperature solder composition such that after the reflow, the solder pads have a melting point at least 30° C. greater than the reflow temperature.

Before or after attaching the photovoltaic cells, a thermoformable polymeric backing film having a thermoforming temperature range is joined 1350 to the bottom surface of the flex-circuit substrate by any of various known techniques. One such technique makes use of an adhesive film that is applied between the flex-circuit substrate and the backing film.

An exemplary method utilizing the principles described above to make an article that comprises a thermoformed photovoltaic module begins by performing the procedure described above to provide a moldable photovoltaic module.

Optionally, a thermoformable polymeric cover film is assembled 1360 over the top side of the flex-circuit substrate and over the cells, and a polymeric fill is applied between the flex-circuit substrate and the cover film so as to cover the cells and fill interstices between the cells with polymeric fill.

The flex-circuit substrate may be provided, prior to cell attachment, with gore panels already defined. Alternatively, gore panels may be defined, e.g., by cutting 1370, after cell attachment. Cutting may be limited to the flex-circuit only, or it may be applied to the sandwiched assembly including the flex-circuit, the backing film, and in implementations also the cover film.

The photovoltaic module is then thermoformed 1380 to the desired shape at a thermoforming temperature that is less than the melting point of the solder pads.

What is claimed is:

1. A photovoltaic module, comprising:
   a flex-circuit that comprises a flexible polymeric substrate and an electrically conductive printed wiring pattern defined on the flexible polymeric substrate;
   a plurality of solder pads defined on the flexible polymeric substrate and electrically continuous with portions of the printed wiring pattern;
   a plurality of photovoltaic cells, each said cell having two back-surface electrical contacts; and
   at least one thermoformable polymeric film substantially parallel to the flexible polymeric substrate and joined thereto, said film having a temperature range for thermoforming;
   wherein:
   each back-surface electrical contact is attached to the flexible polymeric substrate by a respective solder pad of the plurality of solder pads;
   all lateral dimensions of each said cell are at most one centimeter;
   the plurality of solder pads each comprise a solder composition having a remelt temperature that lies above at least a portion of the temperature range for thermoforming the polymeric film;
   the photovoltaic module is conformed in a flat, sheet-like conformation comprising gore panels, wherein the photovoltaic module is capable of being reshaped from the flat, sheet-like conformation into a three-dimensional, curved shape;
   each of the gore panels is a projecting finger of material that extends from a central region of the photovoltaic module, wherein each of the gore panels comprises an edge region;
   in the flat, sheet-like conformation, the edge region of each of the gore panels is separated from the edge regions of adjacent gore panels such that there is a gap between adjacent gore panels; and
   in the three-dimensional, curved shape, the edge region of each of the gore panels directly contacts the edge regions of the adjacent gore panels so as to define a curved, three-dimensional surface without buckling or wrinkling of the flexible polymeric substrate.

2. The photovoltaic module of claim 1, wherein the photovoltaic cells are monocrystalline silicon cells.

3. The photovoltaic module of claim 1, wherein:
   the cells are arranged in a plurality of hexagonal or triangular clusters, each cluster comprising a plurality of individual cells;
   a surface of the flexible polymeric substrate is tiled by the clusters; and
   the clusters are all electrically connected in parallel with each other.

4. The photovoltaic module of claim 1, wherein the photovoltaic module is thermoformed into the three-dimensional, curved shape.

5. The photovoltaic module of claim 1, wherein the at least one thermoformable polymeric film comprises a first thermoformable polymeric film and a second thermoformable polymeric film joined to the flexible polymeric substrate on opposite sides thereof.

6. The photovoltaic module of claim 5, further comprising a polymeric fill that covers the cells and fills interstices between the cells, wherein the polymeric fill is contained between the flexible polymeric substrate and the first thermoformable polymeric film or the second thermoformable polymeric film.

7. The photovoltaic module of claim 5, wherein the first and second thermoformable polymeric films have a temperature range for thermoforming, and the flexible polymeric substrate is not thermoformable in said temperature range for thermoforming.

8. The photovoltaic module of claim 1, wherein the flexible polymeric substrate is situated so as to coincide substantially with a neutral bending plane of said module, and wherein the neutral bending plane is a plane having a side on which bending produces compression and an opposite side on which the same bending produces tension.

9. The photovoltaic module of claim 1, wherein the electrically conductive printed wiring pattern comprises traces that connect cells to each other, and wherein, between points of attachment of the back-surface electrical contacts to the flexible polymeric substrate, the traces are curved such that each trace is at least ten percent longer than a straight-line distance between the points of attachment that the trace connects.

10. The photovoltaic module of claim 1, wherein the flexible polymeric substrate is embossed with a pattern of dimples, and wherein a portion of the printed wiring pattern passes through some of the dimples.

* * * * *